US011106236B2

(12) United States Patent
Taft et al.

(10) Patent No.: US 11,106,236 B2
(45) Date of Patent: Aug. 31, 2021

(54) HIGH SPEED MULTI MODULI CMOS CLOCK DIVIDER

(71) Applicant: Texas Instruments Incorporated, Dallas, TX (US)

(72) Inventors: Robert Callaghan Taft, Munich (DE); Vineethraj Rajappan Nair, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/935,240

(22) Filed: Jul. 22, 2020

(65) Prior Publication Data
US 2021/0026397 A1 Jan. 28, 2021

Related U.S. Application Data

(60) Provisional application No. 62/877,341, filed on Jul. 23, 2019.

(51) Int. Cl.
| | |
|---|---|
| *H03K 21/00* | (2006.01) |
| *G06F 1/10* | (2006.01) |
| *H03L 7/099* | (2006.01) |
| *H03K 5/00* | (2006.01) |
| *H03K 3/03* | (2006.01) |

(52) U.S. Cl.
CPC ............ *G06F 1/10* (2013.01); *H03K 3/0315* (2013.01); *H03K 5/00006* (2013.01); *H03L 7/0995* (2013.01)

(58) Field of Classification Search
CPC ..... G06F 1/10; H03L 7/0995; H03K 5/00006; H03K 3/0315
USPC ........................................................ 327/115
See application file for complete search history.

(56) References Cited

U.S. PATENT DOCUMENTS

| | | | |
|---|---|---|---|
| 5,302,920 A | 4/1994 | Bitting | |
| 5,534,809 A | 7/1996 | Watanabe et al. | |
| 9,018,987 B1 * | 4/2015 | Lahiri | H03L 7/24 327/114 |
| 2008/0069292 A1 | 3/2008 | Straayer et al. | |
| 2019/0052280 A1 * | 2/2019 | Perez | H03L 7/0995 |

OTHER PUBLICATIONS

International Search Report in corresponding PCT Application No. PCT/US2020/043272, dated Oct. 15, 2020 (2 pages).
Yujain Saho et al. "A High-Speed, Low Power Multi-Modulus Frequency Divider Based on TSPC Logic Using 55nm CMOS;" IOP Conf. Series: Materials Science and Engineering 452, 2018 (7 pages).

* cited by examiner

*Primary Examiner* — Ryan Jager
(74) *Attorney, Agent, or Firm* — John R. Pessetto; Charles A. Brill; Frank D. Cimino (57) ABSTRACT

An electronic circuit which is a high speed CMOS logic circuit to divide the frequency of an input signal is provided. The electronic circuit comprises a ring oscillator. The ring oscillator comprises a plurality of gated inverters. At least one of the gated inverters is configured to receive an oscillating signal and a control signal at two complementary inputs. The electronic circuit is configured to be partially gated such that a divide ratio is selectable. By means of clock partial gating, open loop clock buffering and avoiding slow combinatory logic in the data path, a very high speed multi-moduli clock divider is achieved.

20 Claims, 6 Drawing Sheets

FIG. 6

HIGH SPEED MULTI MODULI CMOS CLOCK DIVIDER

CROSS-REFERENCE TO RELATED APPLICATION

This application claims priority to and the benefit of U.S. Provisional Application No. 62/877,341, filed Jul. 23, 2019, which is incorporated herein by reference in its entirety.

FIELD

An electronic circuit to divide the frequency of an input signal is provided.

BACKGROUND

Clock dividers are used to turn the frequency of an input signal into a reduced frequency of an output signal. The ratio between the frequency of the input signal and the output signal is the division factor. Clock dividers are widely used in phase-locked loops.

In phase-locked loops the generated clock needs to be divided down to be compared to the reference clock. It is known to break down the overall clock divider into several stages, where the first stage has highest speed and, therefore, is toughest to design.

The bottleneck of clock dividers is the maximum speed at which they are operable while providing stable divide ratios in view of process-voltage-and-temperature (PVT) variations in the presence of device aging or degradation.

Figure 1:
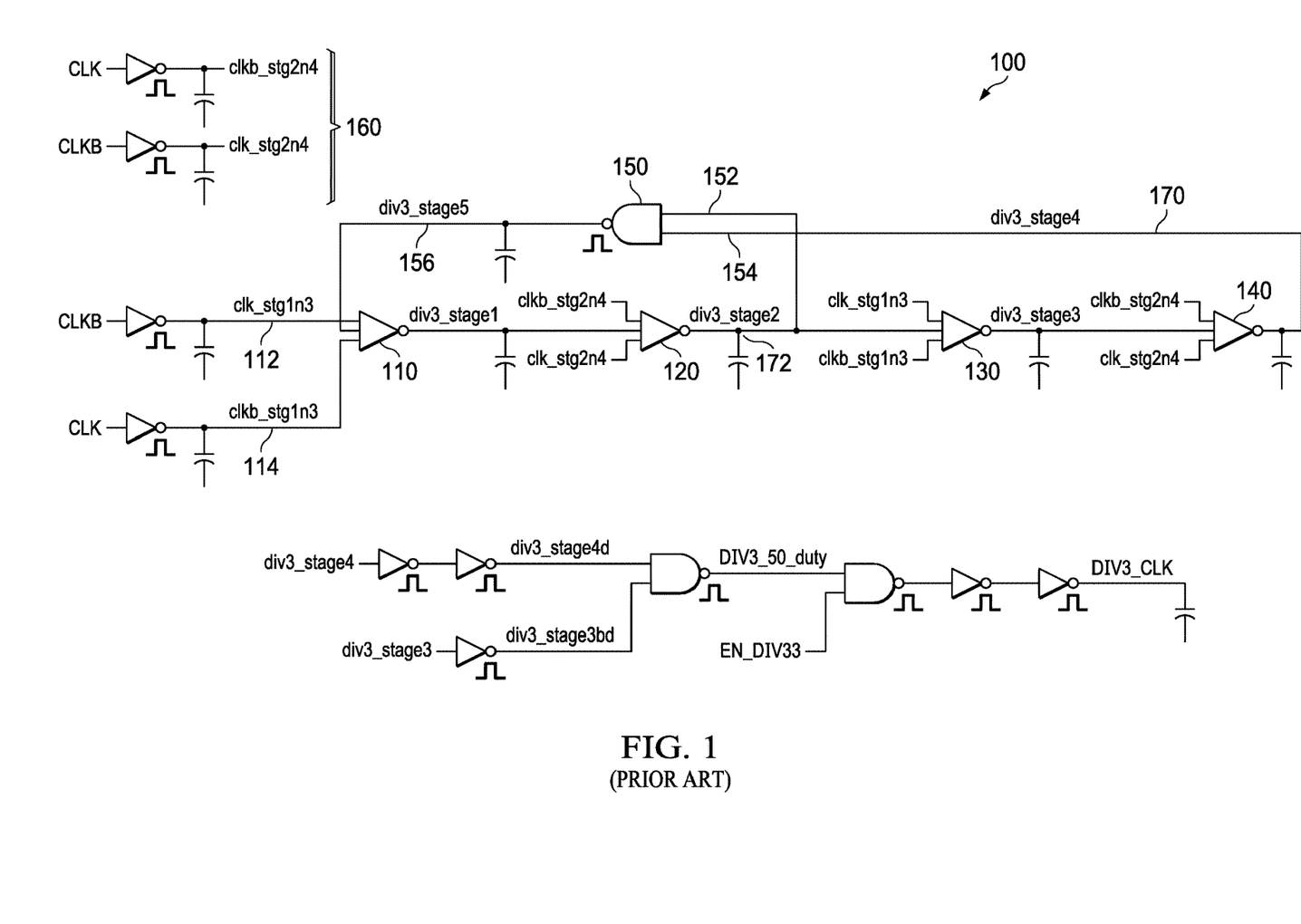
FIG. 1 is a simplified schematic drawing of an example of a CMOS logic circuit functioning as a divide by 3 clock divider according to the prior art.

FIG. 1 is a simplified schematic drawing of an example 100 of a divide by 3 CMOS logic circuit according to the prior art. The circuit consists of four gated inverters 110, 120, 130, 140 connected in series. The outputs of the second gated inverter 120 and the fourth gated inverted 140 are connected to the inputs 152, 154 of a NAND gate 150 and its output 156 is connected to the input of the first gated inverter 110. Each gated inverter has complementary control signal inputs. As an example, the first gated inverter 110 comprises a first and a second complementary input 112, 114. Each of these inputs is driven by an asymmetrical clock driver 160. The asymmetrical clock driver 160 provides higher than 50 percentage duty cycle clocks so that each PMOS transistor and the NMOS transistor within the gated inverter is ON for more than 50 percentage of the clock period. This is to improve the maximum speed of operation. In any case the maximum speed is limited by the propagation delay through the NAND gate 150. To speed up the NAND gate 150 one may increase its driving strength by increase its size, but this increases the load on nodes div3_stage4 170 and especially div3_stage2 172 which in turn becomes the speed bottle neck. The maximum achievable speed will be further reduced if a single divider circuit must be used for providing multiple divide ratios due to the complexity of the circuit which needs more combinatory logic and gated inverters.

SUMMARY

An electronic circuit is provided.

The electronic circuit may be a high speed CMOS logic circuit or may be suitable therefor.

The electronic circuit may be a clock divider.

The electronic circuit may comprise a ring oscillator. The ring oscillator may comprise a plurality of gated inverters. At least one of the gated inverters can be configured to receive an oscillating signal and a control signal at two complementary inputs. The electronic circuit may be configured to be partially gated such that a divide ratio may be selectable.

The ring oscillator may comprise at least three gated inverters. The at least three gated inverters can be arranged in a series connection. An output of each of the gated inverters can be applied to an input of a subsequent of the gated inverters of the ring oscillator.

The control signal may comprise a first signal and a second signal. The first signal and the second signal can be opposite to each other.

A duty-cycle of the control signal may be greater than 0.5.

At least one gated inverter may be partially gated such that it outputs a logic high or logic low depending on a logic state of an input signal. The output signal may be selectable by means of application of partial gating on either PMOS or NMOS.

The electronic circuit may comprise an interconnect.

The gated inverters may have bus holders.

The electronic circuit may be a tri-modulus clock divider.

Divide ratios of at least 1 over 3, 4, and 5 may be selectable.

In another aspect, a clock divider is provided. The clock divider may comprise a plurality of gated inverters subsequently coupled to each other. At least one of the gated inverters may be configured to receive an oscillating signal and a control signal. The clock divider may be configured such that a divide ratio is selectable based on the control signal.

According to yet another aspect an electronic circuit is provided. The electronic circuit may comprise a ring oscillator. The ring oscillator may comprise a plurality of gated inverters. At least one of the gated inverters may be configured to receive an oscillating signal and at least one auxiliary signal at an additional input. The electronic circuit may comprise a plurality of interconnects. The electronic circuit may provide a divide ratio which is selectable based on the at least one auxiliary signal.

BRIEF DESCRIPTION OF DRAWINGS

Further aspects and characteristics of the present application will ensue from the following description of preferred examples with reference to the accompanying drawings, wherein.

DETAILED DESCRIPTION OF EMBODIMENTS

Figure 2:
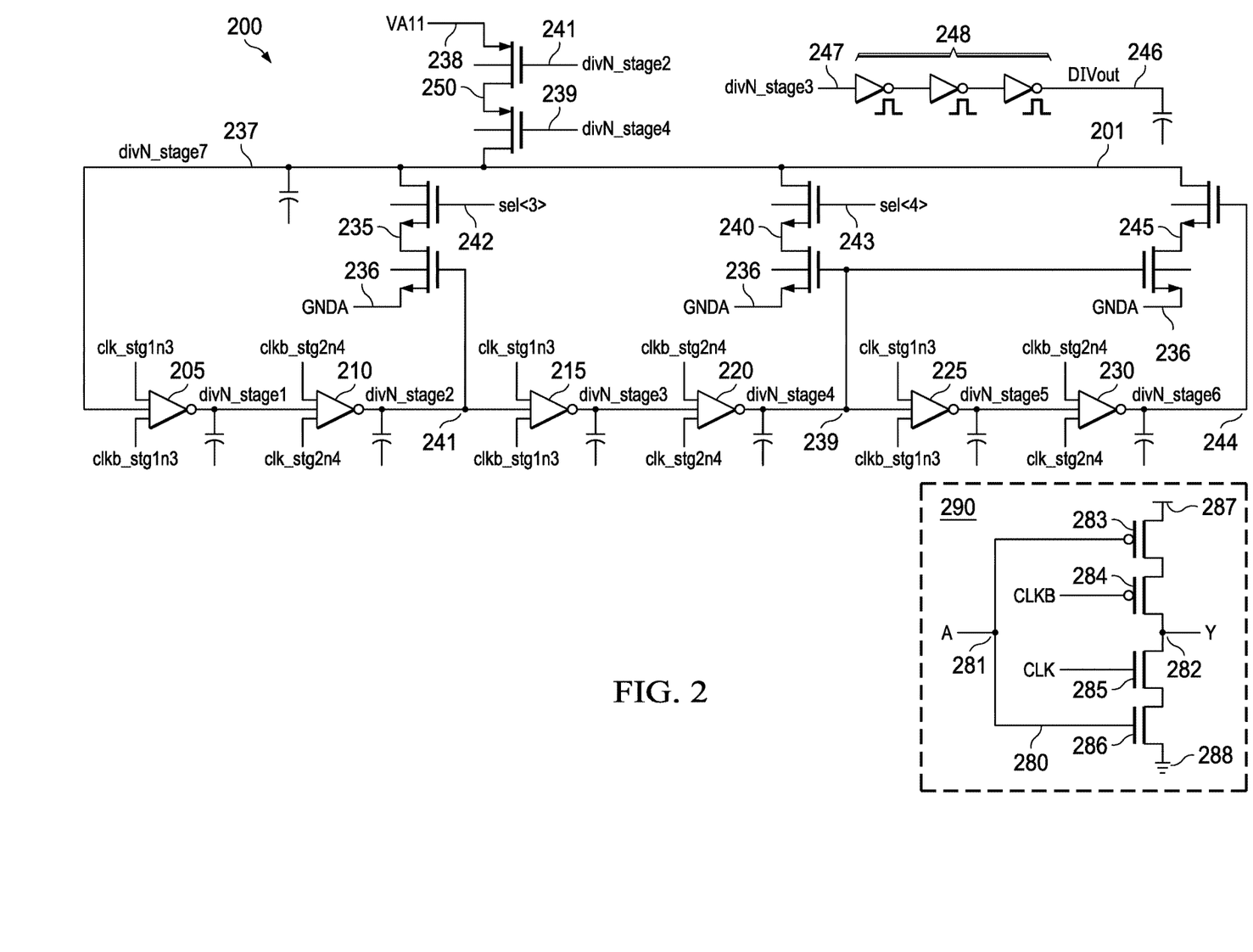
FIG. 2 is a simplified schematic drawing of an example of the clock divider which acts as a multi moduli clock divider.

FIG. 2 is a simplified schematic example of an electronic circuit being configured as a clock divider 200. The clock divider 200 comprises a first to sixth gated inverter 205, 210, 215, 220, 225, 230. The first to sixth gated inverters 205, 210, 215, 220, 225, 230 are arranged in a series connection and are part of a ring oscillator 201. The clock divider 200 also has certain combinatory logic to obtain the required division factors 3, 4 and 5.

An example of a gated inverter 280 is shown in more detail inside the dashed box 290. The gated inverter 280 comprises additional inputs for controlling its operating states.

The gated inverter 280 comprises two p-metal oxide semiconductor (PMOS) transistors 283, 284 and two n-metal oxide semiconductor (NMOS) transistors 285, 286. The drain of the first PMOS 283 is coupled to the source of the second PMOS 284. The source of the first NMOS 285 is coupled to the drain of the second NMOS 286. Between the pair of PMOS 283, 284 and the pair of NMOS 285, 286 a node 282 is arranged providing an output signal Y. This means, the output signal Y is provided at node 282 between the drain of the second PMOS 284 and the drain of the first NMOS 285.

The input signal A is coupled to the gates of the first PMOS 283 and the second NMOS 286 of the gated inverter 280. The control signal comprises a first signal CLK and a second signal CLKB. The first signal CLK is coupled to the gate of the first NMOS 285. The second signal CLKB is coupled to the gate of the second PMOS 284. The second signal CLKB is the opposite of the first signal CLK. This means, if CLK is logic "high", CLKB is logic "low".

Gated inverter 280 supplied with the first and second signals CLK, CLKB can be in a high impedance configuration if the first signal CLK is low and the second signal CLKB is high. Likewise, the gated inverter 280 can be in an inverter configuration if the first signal CLK is high and the second signal CLKB is low. In the inverter configuration, gated inverter 280 can output a high if the input signal A is low and vice versa. The gated inverter 280 can output an always high if the CLK stays low. In this configuration the CLKB is expected to toggle and the input signal A toggles or remains low. It is required to have both CLKB and input signal A become low at certain times together. The gated inverter 280 can output an always low if the CLKB stays high. In this configuration the CLK is expected to toggle and the input signal A toggles or remains high. It is required to have both CLKB and input signal A become high at certain times together.

A supply voltage 287 is coupled to the source of the first PMOS 283. The source of the second NMOS 286 is coupled to ground 288. The second, fourth, and sixth gated inverters 210, 220, 230 of clock divider 200 are similar to gated inverter 280. The first, third, and fifth gated inverters 205, 215, 225 are similar to gated inverter 280, except that the first signal CLK and the second signal CLKB are exchanged compared to gated inverter 280.

Clock divider 200 comprises multiple interconnects 235, 240, 245, 250. The first interconnect 235 is arranged between ground 236 and node divN_stage7 237. The second interconnect 240 is arranged between ground 236 and node divN_stage7 237. The third interconnect 245 is arranged between ground 236 and node divN_stage7 237. The fourth interconnect 250 is arranged between supply voltage VA11 238 and node divN_stage7 237.

Interconnects 235, 240, 245, 250 all comprise a series connection of two PMOS. A gate of one PMOS of the second to fourth interconnect 240, 245, 250 is coupled to node divN_stage4 239 and, therefore, shared between these interconnects. Moreover, a gate of the first interconnect 235 is coupled to node divN_stage2 241. Node divN_stage2 241 is also coupled to a second gate of the fourth interconnect 250.

Select signal sel <3> 242 is coupled to a second gate of the first interconnect 235. Select signal sel <4> 243 is coupled to a second gate of the second interconnect 240. The second gate of the third interconnect 245 is coupled to node divN_stage6 244.

DIVout 246 of clock divider 200 is provided at node divN_stage3 247 after having applied additional inverters 248 for stabilization, buffering and/or runtime adjustments.

The functional principle of clock divider 200 relies on the interconnects 235, 240, 245, 250. The first interconnect 235 creates a DIVout high time (meaning DIVout in state logic "high") of one period (1T). The second interconnect 240 creates a DIVout high time of two periods (2T). The third interconnect 245 creates a DIVout high time of three periods (3T). The fourth interconnect 250 creates a DIVout low time (meaning DIVout in state logic "low") of two periods (2T).

The select signals sel <3> 242 and sel <4> 243 can be used to switch between different divide ratios at DIVout 246. Since the first to third interconnect 235, 240, 245 share the same PMOS (pull-up), the load is reduced such that the DIVout 246 low time is equal for all divide ratios, i.e. the DIVout 246 low time is 2T for all configurations of the select signals sel <3> 242 and sel <4> 243. This leads to different divide ratios provided by clock divider 200. Clock divider 200 is tri-modulus such that by means of the select signals 242, 243 three different divide ratios of /3, /4, and /5 are provided. The control signal can thus be used to efficiently modify the operating state of clock divider 200 such that the divide ratios can be different. Clock divider 200 is applicable for a large number of use cases. Clock divider 200 can operate at a wide range of input clock frequencies. A few MHz to GHz. The maximum speed of operation of the clock divider 200 can be really high, close to 10 GHz.

According to a further aspect, the duty-cycle of the gated inverters 205, 210, 215, 220, 225, 230 may be distorted. This means that a duty-cycle greater than 0.5 may be applied such that more "on"-time is provided. This may be achieved by buffering the clock signals, i.e. the first signal CLK and the second signal CLKB by means of additional inverters which have asymmetric pull-up (PMOS) and pull-down (NMOS) strengths. This leads to a further increase of the maximum speed (sampling time, maximum frequency at which clock divider 200 is operable) of the clock divider 200.

Figure 3:
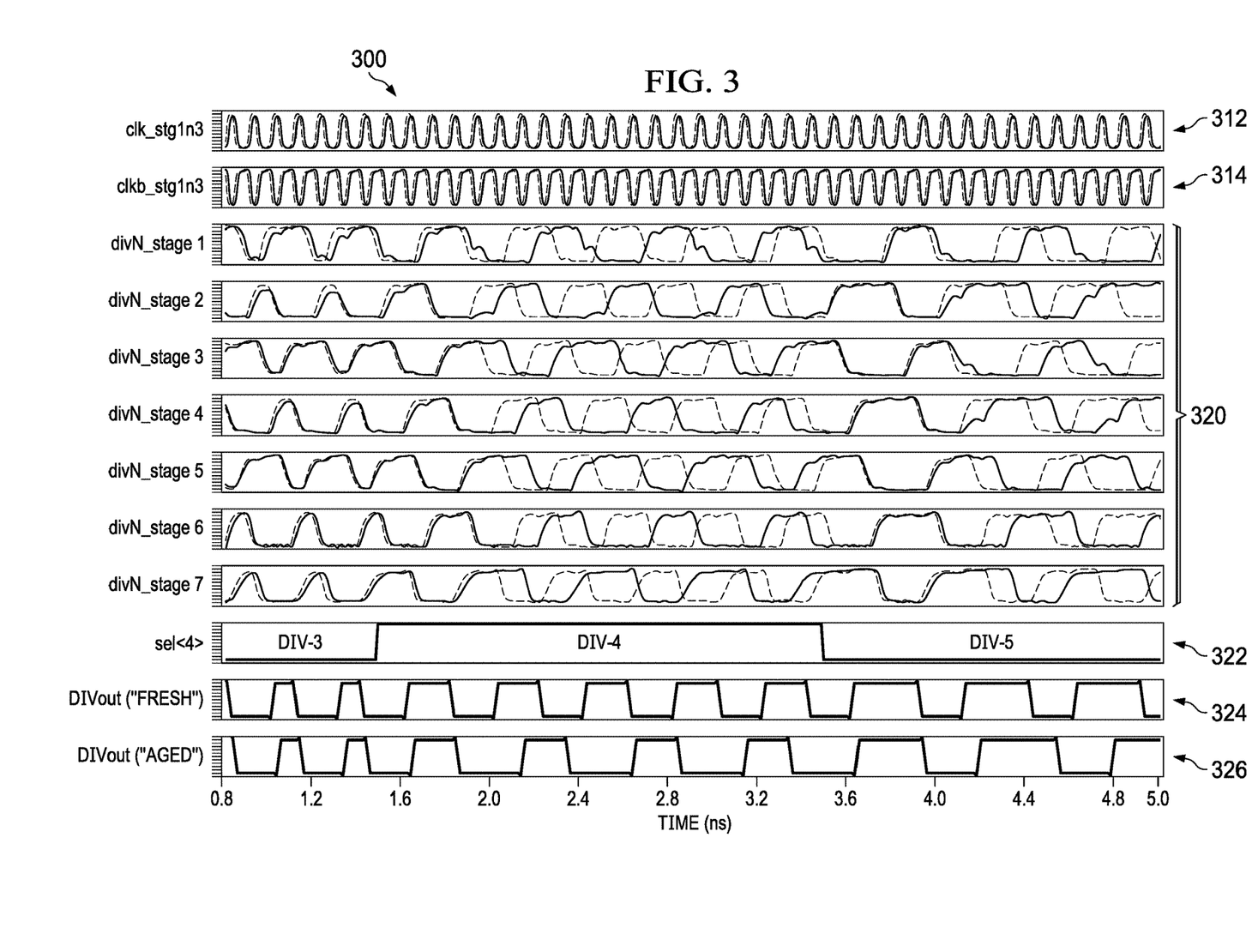
FIG. 3 is a simplified schematic drawing of process signals of the clock divider according to an example.

FIG. 3 shows a schematic drawing of process signals 300 of clock divider 200. On the x-axis time in ns is shown. The y-axis shows amplitudes of the respective signals switching between "high" and "low".

Clk_stg1n3 312 and clkb_stg1n3 314 are the clock signal and the inverse clock signal used for gating the gated inverters 205, 210, 215, 220, 225, 230 of clock divider 200. The clock signal frequency is 10 GHz in FIG. 3.

divN_stage1 to divN_stage7 320 are the output signals of the gated inverters 205, 210, 215, 220, 225, 230 of clock divider 200 as was explained before.

sel <4> 322 is one of the select signals for choosing between the different divide ratios Div-3, Div-4, and Div-5 of clock divider 200. Accordingly, the output signals of the gated inverters, i.e. signals divN_stage1 to divN_stage7 320 vary in correspondence to a switching of sel <4> 322 at different points of time between Div-3, Div-4, and Div-5. DIVout 324 shows the divided output of a fresh silicon simulation and DIVout 326 shows the divided output after 10 years of aging. They provide different ratios between logic "high" and logic "low" based on the state of sel <3> and especially sel <4> 322 such that clock divider 200 provides different divide ratios. From the comparison of DIVout 324 and the "aged" DIVout 326 of clock divider 200 it is apparent that clock divider 200 provides stable output signals for a divide ratio of /3 even after 10 years of aging. This means for a ratio of /3 the output signal DIVout 326 is substantially same with "fresh" DIVout 324 (within negligible tolerance ranges). However, for the remaining divide ratios /4 and /5 DIVout 326 differs from the "fresh" DIVout 324. This means that clock divider 200 is not yet fully capable of providing constant divide ratios at 10 GHz input clock frequency within predefined tolerance ranges (according to industrial needs) for a simulated life time of 10 years taking into account all (physical meaningful) process-voltage-and-temperature (PVT) variations of such a device.

Figure 4:
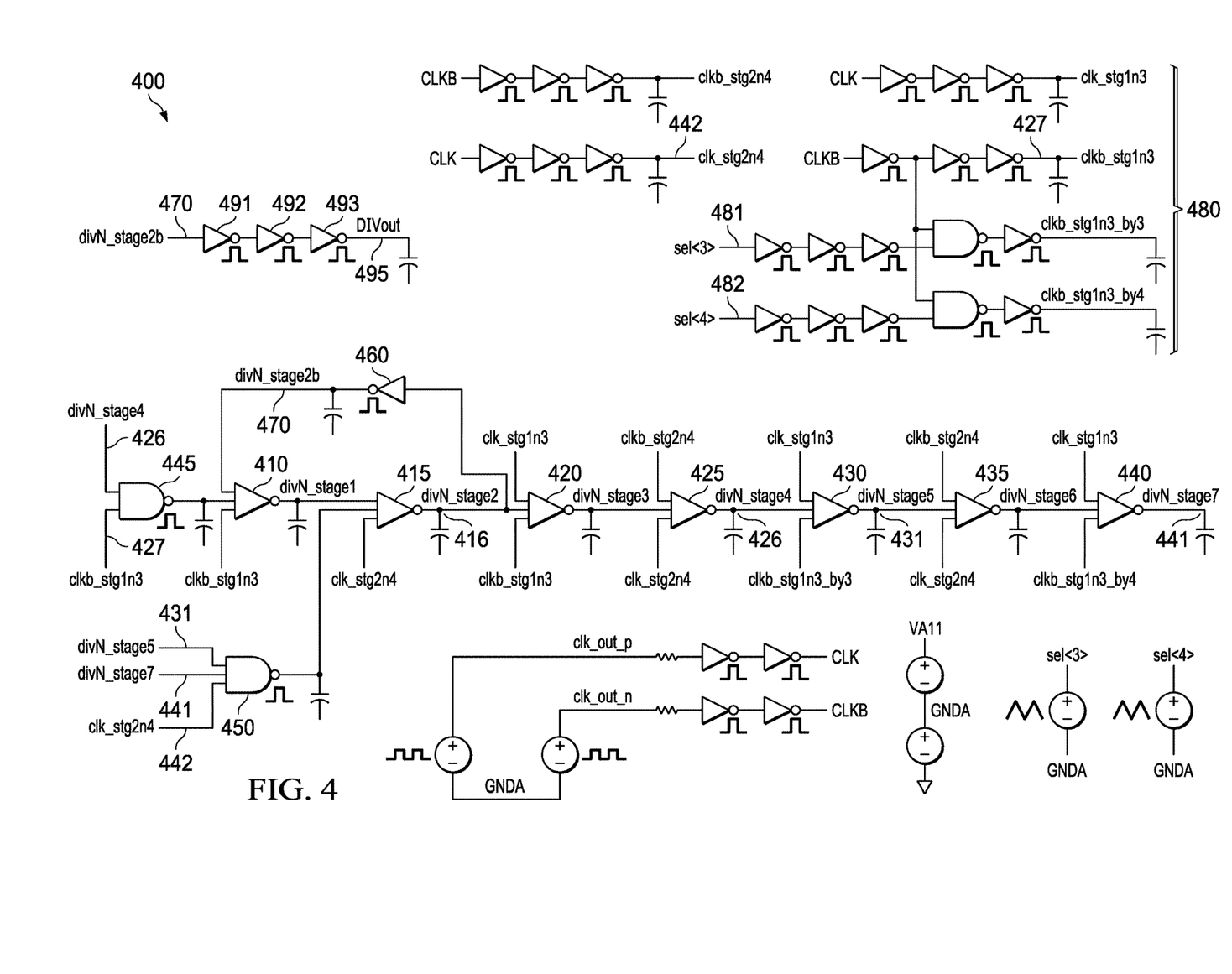
FIG. 4 is a simplified schematic drawing of another example of the clock divider which is an improved multi moduli clock divider.

FIG. 4 shows an improved high speed CMOS logic circuit configured as clock divider 400. This high speed divider 400 can divide the input clock signal by a factor of 3, 4 and 5 even at very high input clock rates. Thus, it is a high speed multi moduli divider.

Clock divider 400 comprises a first to seventh gated inverter 410, 415, 420, 425, 430, 435, 440. The gated inverters 410, 415, 420, 425, 430, 435, 440 of clock divider 400 are of similar type as was explained in detail with reference to clock divider 200. Clock divider 400 comprises an additional inverter 460 arranged in a backward direction between node divN_stage2 416 and node divN_stage2b 470 which itself is coupled to the input of the first gated inverter 410.

Clock divider 400 also comprises NAND2 445, wherein a first input of NAND2 445 is coupled to node divN_stage4 426. The second input of NAND2 445 is coupled to control signal clkb_stg1n3 427. The output of NAND2 445 is coupled to the PMOS control input of the first gated inverter 410.

Furthermore, clock divider 400 comprises NAND3 450, wherein a first input is coupled to node divN_stage5 431. A second input of NAND3 450 is coupled to node divN_stage7 441 which itself is coupled to the output of the seventh gated inverter 440. The third input of NAND3 450 is coupled to control signal clk_stg2n4 442. The output of NAND3 450 is coupled to the PMOS control input of the second gated inverter 415.

Control signals 480 are provided based on the clock signal CLK and the inverse clock signal CLKB as well as select signals sel <3> 481 and sel <4> 482. Again, based on the select signals sel <3> 481 and sel <4> 482 different divide ratios of the clock divider 400 are selectable.

DIVout 495 of clock divider 400 is provided at node divN_stage2b 470 after applying runtime adjustments, stabilization and/or buffering by means of additional inverters 491, 492, 493.

NAND2 445 creates DIVout 495 high time of two periods (2T). Additional inverter 460 creates DIVout 495 low time of one period (1T). Node divN_stage5 431 creates DIVout 495 low time of two periods (2T). Node divN_stage7 441 creates DIVout 495 low time of three periods (3T). Since NAND2 445 is shared by the different moduli of clock divider 400, different divide ratios have DIVout 495 high time of two periods (2T).

Furthermore, gating the clock to the PMOS pull-up of the gated inverter can be used to increase the low time of its output for an arbitrary number of cycles.

Clock divider 400 provides different moduli (divide ratios) which are selectable by gating only the clock signal CLK (first control signal) coupled to the NMOS in the gated inverter 430 ("half latch") or gated inverter 440. This means that the gated inverter 430 or gated inverter 440 is partially gated (half-gated) as the inverse clock signal CLKB (second control signal) and the incoming input signal pulls the output to a known state through the PMOS.

In other words, only one of the PMOS and NMOS (pull-up or pulldown) clocks of the gated inverter are gated. Consequently, since only one side of the gated inverters is gated the power consumption is low due to requiring lower drive-strength for the gated clocking. The power consumption can even be reduced further if only the NMOS is gated since for equal drive strengths, the PMOS size is at least two times larger than the NMOS. By means of half gating, the circuit is very simple and compact compared to a scenario according to which both, PMOS and NMOS, were gated. According to a further aspect, if both were gated, the gated inverter would be "tri-stated" with an undefined output. By only gating e.g. the NMOS, the PMOS will regularly pull up the output to a known state since the data going into the gated inverter toggles up and down. In other words, based on the data going into the gated inverter, the output signal is defined.

For clock divider 400, the three different moduli (divide ratios) are selected by gating clocks rather than using combinatorial logic on the data different than in case of clock divider 200. Clocks can be buffered "open loop" which allows breaking out of the speed box, i.e. which allows the maximum speed at which clock divider 400 is operable to be even higher than the maximum speed at which clock divider 200 is operable.

The clock dividers 200, 400 described herein can be configured for high frequencies, e.g. frequencies above 100 MHz, preferably above 1 GHz, more preferably close to or even above 10 GHz or radio frequency. Clock dividers 200, 400 can be suitable for use in analog-to-digital converters (ADCs) or phase-locked loops (PLLs).

The clock dividers 200, 400 can be configured to work robustly for the lifetime of an underlying product (more than ten years). Due to its robustness the clock dividers 200, 400 can be configured to provide predefined specifications for all (physical meaningful) process-voltage-and-temperature (PVT) variations in the presence of device aging or degradation. In particular, clock divider 400 can be configured for operation at frequencies larger than 10 GHz in a 65 nm topology for all (physical meaningful) PVT variations in the presence of device aging or degradation.

In an example use case the electronic circuit can be implemented as a clock divider 200, 400 in a PLL. The PLL generated clock may be needed to be divided down to be compared to a reference clock. For providing the slow-down the overall clock divider may be broken into several stages, where the first stage may have highest speed (operating frequency at which this stage may be operable) and the toughest to design. For specific use cases of the PLL, the clock divider of the first stage (the prescalar) may be required to be tri-modulus providing selectable divide ratios of /3, /4, and /5. The present electronic circuit representing example clock dividers 200, 400 can be configured to fulfill these requirements.

However, the electronic circuit is generic and, therefore, not restricted for implementation in ADCs or PLLs.

Figure 5:
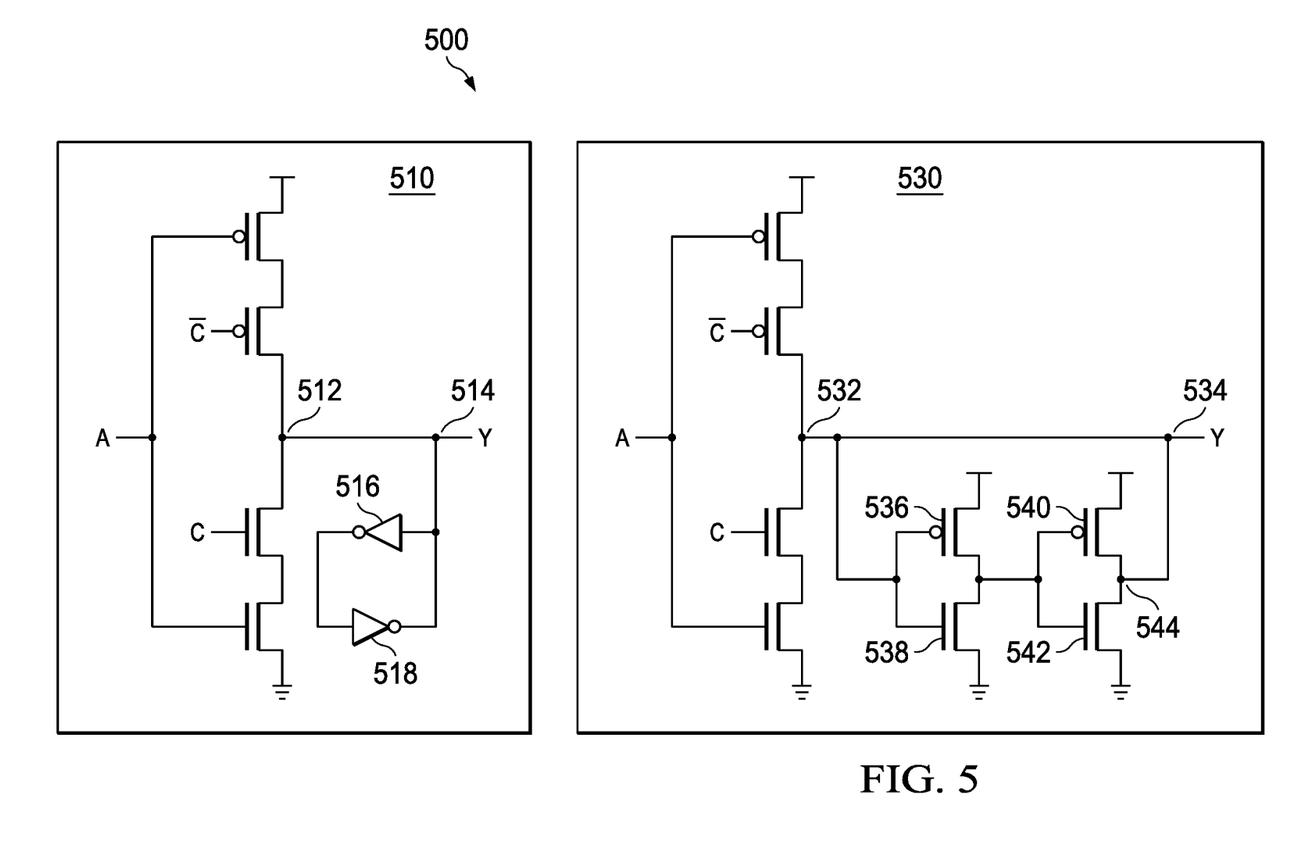
FIG. 5 is a simplified schematic drawing of a gated inverter.

FIG. 5 is a simplified schematic drawing of a gated inverter including a bus holder.

In box 510 the gated inverter is shown according to a gate-level representation. In box 530 the gated inverter is shown according to a transistor representation.

In box 510 subsequent to node 512 a ring configuration including a first inverter 516 and a second inverter 518 is shown. The output signal Y provided at node 514.

In box 530 the first inverter 516 and the second inverter 518 are shown according to the transistor representation. Each of the first and second inverter 516, 518 comprises a PMOS 536, 540 and a NMOS 538, 542.

In any case, the first and second inverter 516, 518 provide a capacitive effect. Accordingly, the clocks can be stopped without the output 514, 534 of the gated inverter drooping or changing its value. Therefore, crow-bar currents are avoided.

All gated inverters of clock divider 200 and clock divider 400 include bus holders. However, in general, bus holders are optional and not mandatory for the clock dividers 200, 400.

Figure 6:
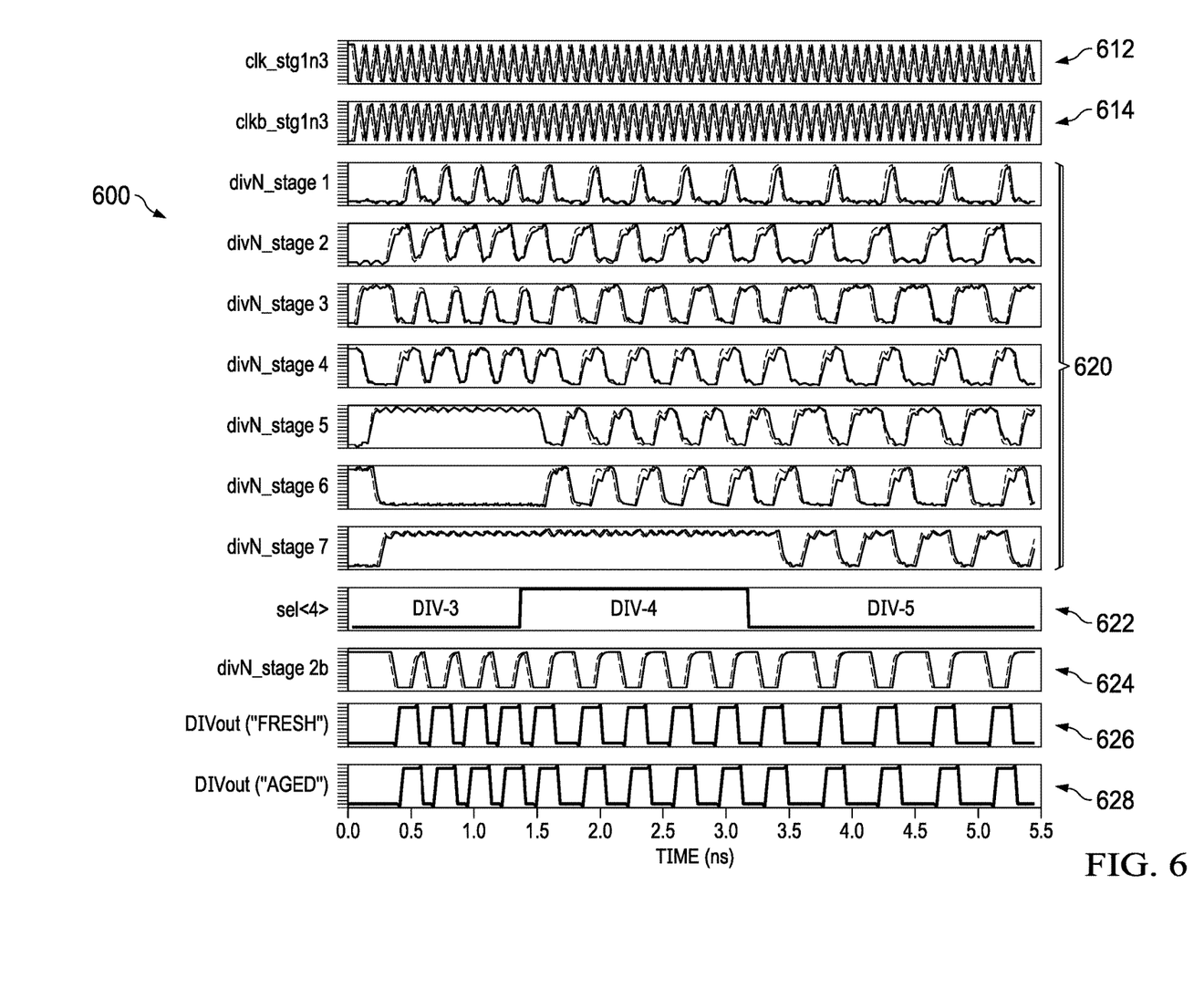
FIG. 6 is a simplified schematic drawing of process signals of the clock divider according to an example.

FIG. 6 is a simplified schematic drawing of process signals 600 of the example according to clock divider 400. The principle layout of FIG. 6 corresponds to FIG. 3 showing process signals 300 of clock divider 200. Comparison of these figures therefore provides a measure of the performances of both examples of the clock dividers 200, 400. Again, on the x-axis time in ns is shown. The y-axis shows amplitudes of the respective signals switching between "high" and "low".

Clk_stg1n3 612 and clkb_stg1n3 614 are the clock signal and the inverse clock signal used for gating the gated inverters. The clock signal frequency is 11 GHz in FIG. 6.

divN_stage1 to divN_stage7 620 are the output signals of the gated inverters 410, 415, 420, 425, 430, 435, 440 of clock divider 400.

sel <4> 622 is one of the select signal for choosing between the different divide ratios Div-3, Div-4, and Div-5 of clock divider 400. Accordingly, the output signals of the gated inverters, i.e. signals divN_stage1 to divN_stage7 620 vary in correspondence to a switching sel <4> at different points of time between Div-3, Div-4, and Div-5. DIVout 626 shows the divided output of a fresh silicon simulation and DIVout 628 shows the divided output after 10 years of aging. They provide different ratios between logic "high" and logic "low" based on the state of sel <3> and especially sel <4> 622 such that clock divider 400 provides different divide ratios.

As is apparent from the comparison of the "aged" DIVout 628 and the "fresh" DIVout 626 both signals are substantially same for all divide ratios /3, /4, and /5 even after a simulated life time of 10 years and all (physical meaningful) PVT variations. This means, by avoiding slow combinatorial logic applied to the data, by only half-gating the gated inverters, and by configuring clock divider 400 according to an "open loop" clock buffering configuration, clock divider 400 achieves high maximum speeds. Clock divider 400 is operable at frequencies above 11 GHz and provides constant divide ratios at these frequencies for a lifetime of more than 10 years (within negligible tolerance ranges). Accordingly, the divide ratios are provided at these frequencies even for all (physical meaningful) process-voltage-and-temperature (PVT) variations in the presence of device aging or degradation.

Although the disclosure has been described hereinabove with reference to specific examples, it is not limited to these examples and no doubt further alternatives will occur to the skilled person that lie within the scope of the clock divider as claimed.

The invention claimed is:

1. An electronic circuit being a high speed CMOS logic circuit comprising a ring oscillator, the ring oscillator comprising a plurality of gated inverters, at least one of the gated inverters being configured to receive an oscillating signal and a control signal at two complementary inputs, wherein the electronic circuit is configured to be partially gated such that a divide ratio is selectable.

2. The electronic circuit of claim 1, wherein the electronic circuit is a clock divider, and wherein a divide ratio is selectable.

3. The electronic circuit of claim 1, wherein the ring oscillator comprises at least three gated inverters, wherein the at least three gated inverters are arranged in a series connection, and wherein an output of each of the gated inverters is applied to an input of a subsequent of the gated inverters.

4. The electronic circuit of claim 1, wherein the control signal comprises a first signal and a second signal, wherein the first signal and the second signal are opposite to each other.

5. The electronic circuit of claim 4, wherein at least one gated inverter is partially gated such that it outputs a logic high or logic low depending on a logic state of an input signal and is selectable by means of application of partial gating on either PMOS or NMOS.

6. The electronic circuit of claim 1, wherein a duty-cycle of the control signal is greater than 0.5.

7. The electronic circuit of claim 1 comprising at least four gated inverters arranged in a series connection, wherein an output of each of the gated inverters is applied to an input of a subsequent of the gated inverters, wherein the electronic circuit comprises at least one interconnect between at least two of the gated inverters, and wherein the interconnect comprises at least one of a PMOS and a NMOS.

8. The electronic circuit of claim 1, wherein the gated inverters have bus holders.

9. The electronic circuit of claim 1, wherein the electronic circuit is a tri-modulus clock divider.

10. The electronic circuit of claim 9, wherein divide ratios of at least 1 over 3, 4, and 5 are selectable.

11. Clock divider comprising a plurality of gated inverters subsequently coupled to each other, at least one of the gated inverters being configured to receive an oscillating signal and a control signal, wherein the clock divider is configured such that a divide ratio is selectable based on the control signal.

12. The clock divider of claim 11, wherein a ring oscillator comprises at least three gated inverters, wherein the at least three gated inverters are arranged in a series connection, and wherein an output of each of the gated inverters is applied to an input of a subsequent of the gated inverters.

13. The clock divider of claim 11, wherein the control signal comprises a first signal and a second signal, wherein the first signal and the second signal are opposite to each other.

14. The clock divider of claim 13, wherein at least one gated inverter comprises two complementary inputs and is partially gated such that it outputs a logic high or logic low depending on a logic state of an input signal and is selectable by means of application of partial gating on either PMOS or NMOS.

15. The clock divider of claim 11, wherein a duty-cycle of the control signal is greater than 0.5.

16. The clock divider of claim 11, wherein the clock divider is a tri-modulus clock divider.

17. The clock divider of claim 16, wherein divide ratios of at least 1 over 3, 4, and 5 are selectable.

18. An electronic circuit comprising a ring oscillator, the ring oscillator comprising a plurality of gated inverters, at least one of the gated inverters being configured to receive an oscillating signal and at least one auxiliary signal at an additional input, wherein the electronic circuit comprises a plurality of interconnects and provides a divide ratio which is selectable based on the at least one auxiliary signal.

19. The electronic circuit of claim 18, wherein divide ratios of 1 over 3, 4, and 5 are achievable for a life time of 10 years at frequencies larger than 10 GHz.

20. The electronic circuit of claim 19, wherein the at least one gated inverter outputs a logic high or logic low depending on a logic state of an input signal and is selectable by means of application of partial gating on either PMOS or NMOS.

* * * * *